United States Patent [19]

Hall

[11] 4,247,851
[45] Jan. 27, 1981

[54] DISPLAY SYSTEM

[76] Inventor: David S. Hall, 238 Calvary St., Waltham, Mass. 02154

[21] Appl. No.: 40,552

[22] Filed: May 21, 1979

[51] Int. Cl.³ .............................................. G06F 3/14
[52] U.S. Cl. .................................. 340/706; 235/310; 340/715; 340/799; 340/802; 364/551
[58] Field of Search .................. 340/706, 715, 802; 364/550, 551, 556, 709, 715; 235/310

[56] References Cited

U.S. PATENT DOCUMENTS

| | | | |
|---|---|---|---|
| 4,041,289 | 8/1977 | Brosh et al. | 364/567 |
| 4,051,356 | 9/1977 | Hakata | 235/310 |
| 4,071,743 | 1/1978 | Upton | 235/310 X |
| 4,100,602 | 7/1978 | Shapiro | 364/715 |
| 4,109,312 | 8/1978 | Beutel | 364/550 X |
| 4,161,649 | 7/1979 | Klos et al. | 364/551 X |

Primary Examiner—David L. Trafton
Attorney, Agent, or Firm—Joseph S. Iandiorio

[57] ABSTRACT

A display system for selectively displaying a given value and associated units including a value input circuit for providing values to be displayed; actuator means for selecting the values and/or units to be displayed; a units select circuit, responsive to operation of the actuator means and the predetermined value from the input circuit for selecting the units to be displayed; display means; a units display circuit for enabling the display means to display the units chosen by the units select circuit when the input circuit provides a value other than the predetermined value; and a value display circuit for enabling the display means to display the value from the input circuit when that value is other than the predetermined value and the actuator means is unactuated.

11 Claims, 4 Drawing Figures

DISPLAY SYSTEM

FIELD OF INVENTION

This invention relates to a display system for selectively displaying a given value and associated units, and more particularly to such a system useful with a tachometer system.

BACKGROUND OF INVENTION

Typically, tachometer systems present the measured value in one specific set of units, e.g. revolutions per minute (rpm); revolutions per second (rps); feet per second (fps); and the answer must be converted to whatever other units are desired by the use of the system. Often if more than one unit of measurement is required there is provided a meter readout with a plurality of scales calibrated to the various units. Such multi-scale meter readouts are not compatible with digital displays.

SUMMARY OF INVENTION

It is an object of this invention to provide an improved display system which selectively displays a given value or one of a number of units associated with the value.

It is a further object of this invention to provide such a display system capable of displaying either a given value, selected units, or both alternately.

It is a further object of this invention to provide such a display system capable of displaying either a current value or a past recorded value.

It is a further object of this invention to provide such a display system capable of quickly confirming the presently selected units to be displayed.

It is a further object of this invention to provide such a display system capable of displaying the selected units in the absence of a given value for display and recalling for present use the units chosen during previous operation of the system.

It is a further object of this invention to provide such a a display system useful in a tachometer system.

The invention features a display system for selectively displaying a given value and associated units. There is a display means and a value input circuit for providing values for display, and actuator means for selecting the values and/or units to be displayed. A units select circuit responsive to operation of the actuator means and receipt of a predetermined value from the input circuit selects the units to be displayed. A units display circuit enables the display means to display the units chosen by the units select circuit when the input circuit provides a value other than the predetermined value. A value display circuit enables the display means to display the value from the input circuit when the value is other than the predetermined value and the actuator means is unactuated.

In a preferred embodiment there is also included a memory circuit for storing a value presented by the input circuit, and a memory set circuit for enabling the memory circuit to store the value presented by the input in response to the value being other than the predetermined value and the actuator being operated.

The memory circuit is enabled to clear any stored value in response to the units select circuit choosing a unit to be displayed. A units value alternate circuit enables the display means alternately to display the value stored in the memory circuit and the units which have been selected in response to the memory circuit being set and the actuator being operated.

The units selected may include a units memory for storing units to be selected and means, when enabled, for sequentially reading out the units memory. There are means for enabling the means for reading out after a predetermined interval and logic means responsive to the input circuit and the actuator for initiating the interval when the actuator is operated and ceasing the sequential reading out when the operation of the actuator is ceased. The units display circuit may include logic means responsive to the input circuit providing other than the predetermined value, and to the memory circuit having no value stored in it to provide the necessary output to the display means.

The value display circuit includes logic means responsive to the presence of a value other than the predetermined value and to the absence of operation of the actuator, as well as the absence of the value stored in the memory circuit, to enable display in the display means of the value from the input circuit. Units/value alternate circuit includes means for enabling the display means to sequentially, alternately display the value from the memory circuit and the selected units. Logic means, responsive to the absence of operation of the actuator and to the presence of a value stored in the memory circuit, operates the means for enabling. The memory set circuit includes logic means responsive to operation of the actuator and to the value other than the predetermined value from the input circuit, to provide the necessary output to set the memory circuit. The units select circuit may further include a storage for storing the value in the units memory upon loss of power and restoring that value to the units memory upon restoration of power.

DISCLOSURE OF PREFERRED EMBODIMENT

Other objects, features and advantages will occur from the following description of a preferred embodiment and the accompanying drawings, in which.

Figure 1:
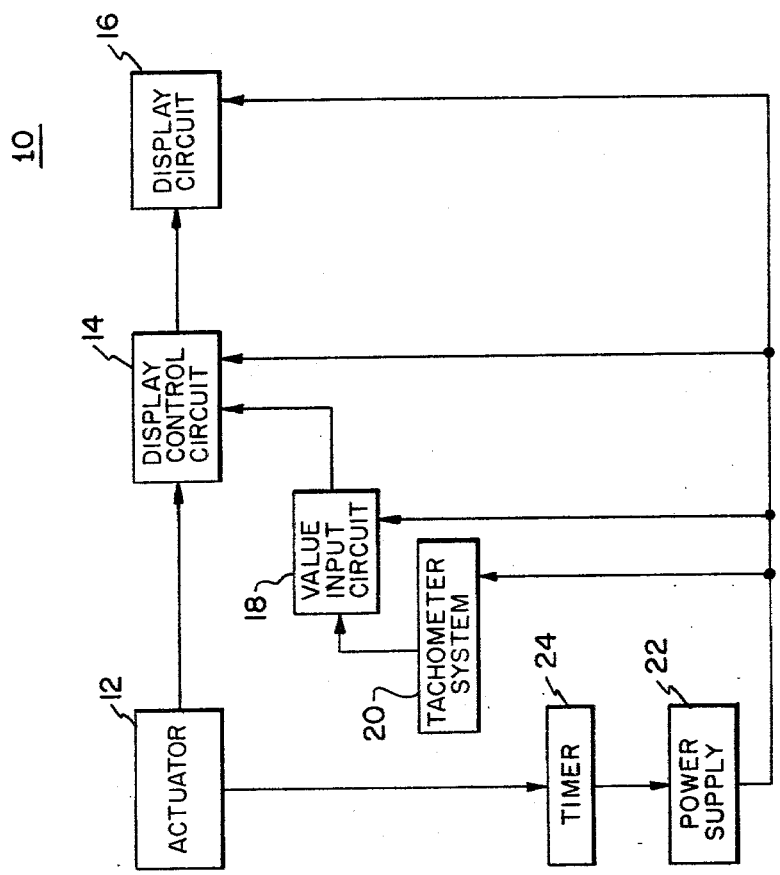
FIG. 1 is a block diagram of a display system according to this invention used with a tachometer system.

There is shown in FIG. 1 a display system 10 according to this invention which includes an actuator 12, display control circuit 14, dislay circuit 16, and a value input circuit 18. Value input circuit 18 may receive an input from tachometer system 20. The entire system is initialized by operation of actuator 12, which also operates power supply 22 to energize the various components. A timer 24 may be introduced to automatically turn off the system after a predetermined period without further intervention of actuator 12.

Display control circuit 14, in conjunction with display circuit 16, selectively displays either the value from input circuit 18 or some units, e.g. rpm, rps, chosen to be displayed in association with that value, or may alternately display both the value and the associated units, in dependence upon the operation of actuator 12 and other conditions in the system as explained below.

Figure 2:
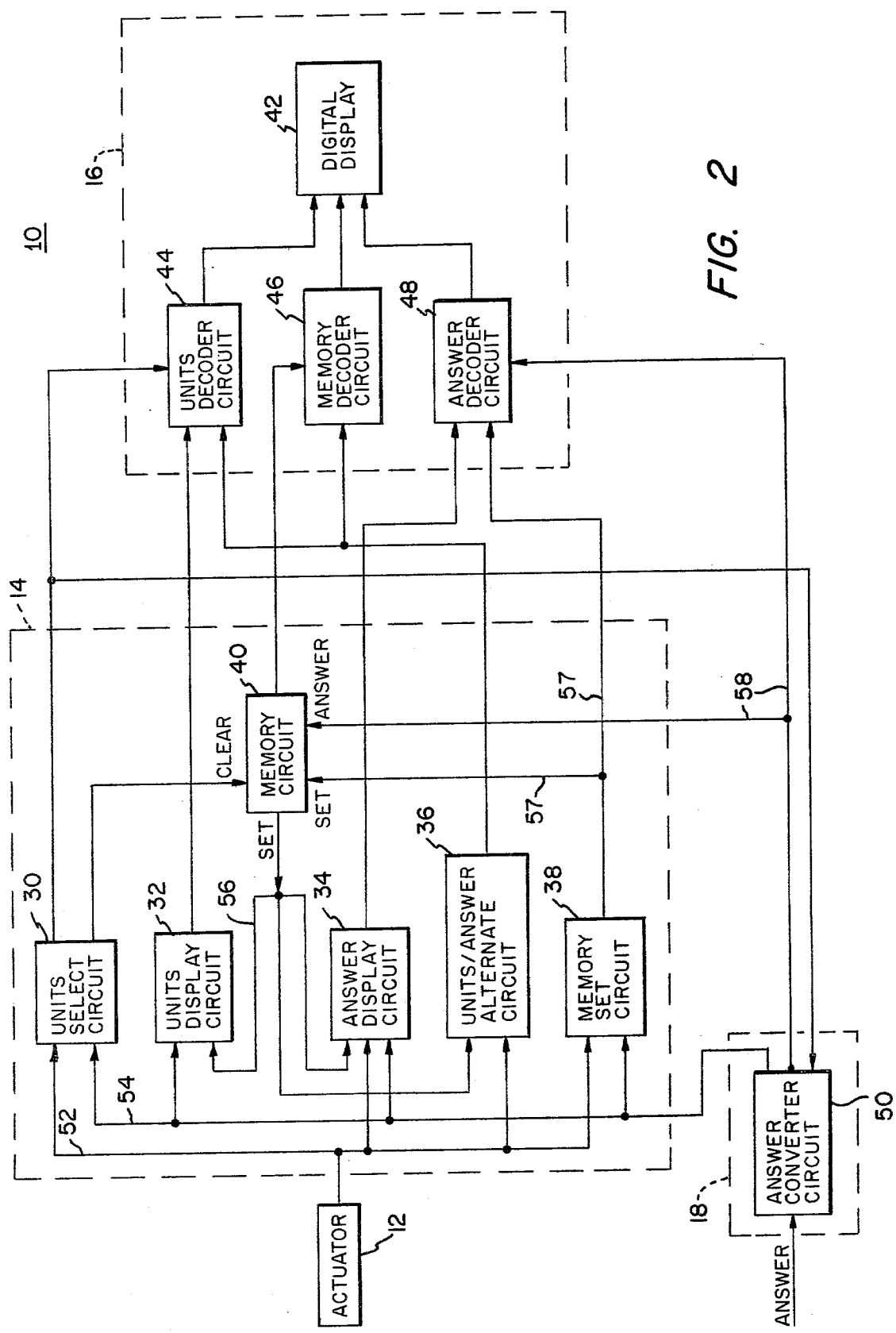
FIG. 2 is a more detailed block diagram of the display control circuit and display circuit according to this invention.

Display control circuit 14 may include a units select circuit 30, FIG. 2, units display circuit 32, answer display circuit 34 units/answer alternate circuit 36, memory set circuit 38, and memory circuit 40. Display circuit 16 may include a digital display 42 and three decoders; units decoder circuit 44, memory decoder circuit 46, and answer decoder circuit 48. Value input circuit 18 may include an answer converter circuit 50.

Units select circuit 30 responds to operation of actuator 12 on line 52 and the presence of a predetermined value on line 54 from answer converter circuit 50 to clear memory 40 and provide to units decoder circuit 44 a representation of the units desired to be displayed in digital display 42. Units select circuit 30 at this time also supplies an indication to answer converter circuit 50 of the units in which the answer is to be displayed in answer decoder circuit 48. This may take the form of a simple multiplier factor by which the incoming answer is multiplied in answer converter circuit 50. Units display circuit 32 also responds to the appearance on line 54 of the predetermined value to provide an output to units decoder circuit 44 that enables it to deliver to digital display 42 the units indication provided by units select circuit 30. The second input to units display circuit 32 is from memory circuit 40 and indicates that memory circuit 40 is not set; that is, it presently contains no value stored therein.

Answer display circuit 34 also responds to an absence of any value being stored in memory circuit 40, along with the absence of operation of actuator 12 and the appearance of some value on line 54 other than the predetermined value, to enable answer decoder circuit 48 to deliver the digital display 42 whatever answer is presently being presented to decoder circuit 48 from answer converter circuit 50. Units/answer alternate circuit 36 also responds to the absence in memory circuit 40 of any value and to the absence of operation of actuator 12 to alternately, sequentially enable units decoder circuit 44 and memory decoder circuit 46 to deliver this respective information to digital display 42. Units decoder circuit 44 receives units indication from units selector 30, while memory decoder circuit 46 receives the stored value from memory circuit 40.

Finally memory set circuit 38 responds to the operation of actuator 12 and the presence of a value other than the predetermined value on line 54 to enable answer decoder circuit 48 to deliver to digital display 42 a value to be displayed. Simultaneously with its enablement of answer decoder circuit 48, memory set circuit 38 sets memory circuit 40 via line 57. The setting of memory circuit 40 by memory set circuit 38 enables the answer provided on line 58 to be stored in memory circuit 40. Memory circuit 40 then supplies a set signal on lines 56 to units display circuit 32, answer display circuit 34, and units/answer alternate circuit 36.

Figure 3:
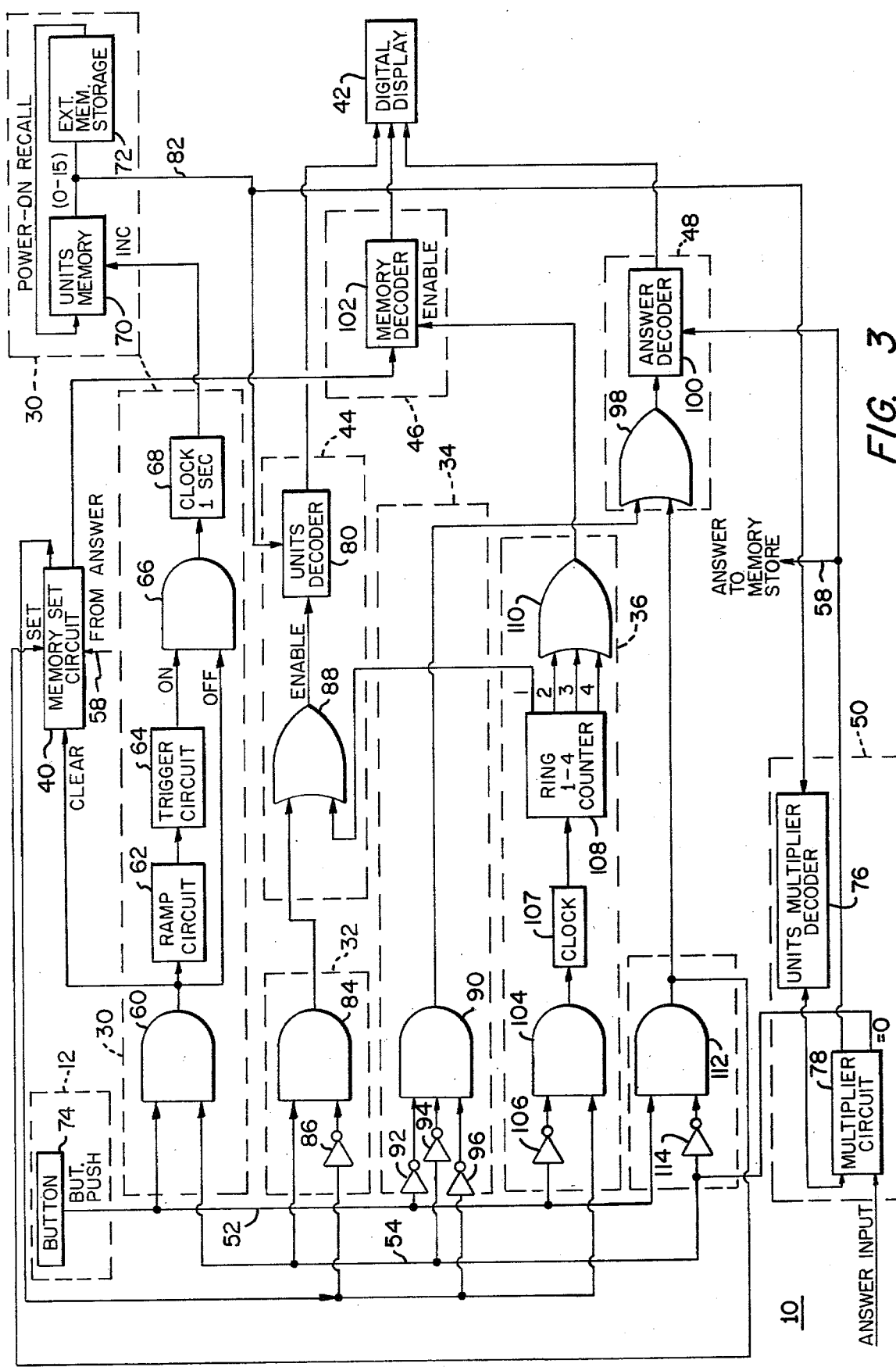
FIG. 3 is a more detailed diagram of the system shown in FIG. 2.

The operation of display system 10 according to this invention may be better understood with respect to FIG. 3, where the various components are shown in greater detail.

Units select circuit 30 includes AND circuit 60, ramp circuit 62, trigger circuit 64, a second AND gate 66, and a one-second clock 68. Units select circuit 30 also includes a unit memory 70 and external memory storage 72.

Actuator 12 may include a simple push-button switch 74 and answer converter circuit 50 may include a units multiplier-decoder 76 and a multiplier circuit 78. Units multiplier decoder 76 receives the required multiplier from units select circuit 30, decodes it, and provided the factor resulting from the decoder to multiplier circuit 78, where it is multiplied by the answer to provide the proper value on output line 58.

When button 74 is operated and the output on line 54 from multiplier circuit 78 indicates the predetermined value, for example shaft speed zero, corresponding to no shaft rotation in a tachometer device, AND gate 60 provides an input to clear memory circuit 40 and initiates operation of ramp circuit 62. The output from AND gate 60 also provides one input to AND gate 66. After a predetermined interval, for example three seconds, the voltage developed at the output of ramp circuit 62 is sufficient to operate trigger circuit 64, which then provides a second input to AND gate 66 that enables it to operate one-second clock 68. One-second clock 68 provides a pulse each second to units memory 70, and each second units memory 70 reads out a different unit which is decoded by units decoder 80 in units decoder circuit 44. The units presently being read out from units memory 70 appears on line 82 and is stored in external memory storage 72. Should the power go off at any time, the units indication presently carried on line 82 is stored in external memory storage 72. When the power is restored, the units previously on line 82 preserved in external memory storage 72, are immediately returned to memory 70 and appear once again on line 82.

Units display circuit 32 includes AND gate 84 and inverter 86. When the signal on line 54 indicates anything other than a zero shaft speed and when the memory is not set, that is contains no value stored in it, AND gate 84 provides an input to OR gate 88 in units decoder circuit 44, enabling it to provide to digital display 42 the units information currently presented to units decoder 80 on line 82.

Answer display circuit 34 may include AND gate 90 and three inverters 92, 94, and 96. In the absence of a tachometer speed of 0, as indicated on line 54 and in the absence of actuation of button 74 and the absence of any value stored in memory circuit 40, AND circuit 90 provides an output through OR gate 98 to enable answer decoder 100 in answer decoder circuit 48 to deliver to digital display 42 the tachometer speed value appearing on line 58.

Memory decoder circuit 46 may include simply a memory decoder 102, which is every ready to decode and deliver to digitial display 42 the representation of any value stored in memory circuit 40. The value in memory circuit 40 is displayed by means of memory decoder 102 alternately with the units from units decoder 80 in digital display 42 under the guidance of the units/answer alternate circuit 36. Units/answer alternate circuit 36 includes AND gate 104 and inverter 106. When memory circuit 40 is set, that is, has some value stored in it, and button 74 is not actuated, AND gate 104 provides an output to clock circuit 107 which cycles ring counter 108 through its four states. In the first state, ring counter 108 provides a signal to OR gate 88, thereby enabling units decoder 80 to provide its output to digital display 42. During the remaining portion of the cycle, ring counter 108 provides its outputs during stages 2, 3, and 4 to OR gate 110, which enables memory decoder 102 to provide the value stored in memory 40 to digital display 42. As long as AND gate 104 is enabled, clock 106 continues to cycle ring counter 108 and digital display 42 continues to display alternately the units of the speed of the tachometer for one quarter of the interval and the magnitude of the speed during the remaining three quarters of the interval.

Memory set circuit 38 includes AND gate 112 and inverter 114. When button 54 is actuated and the signal on line 74 indicates a speed not equal to zero, AND gate 112 provides an output which sets memory 40, thereby storing in it whatever value provided to it on line 58 from multiplier circuit 78. Simultaneously, AND gate 112 through OR gate 98 enable answer decoder 100 to provide the same answer on line 58 to be displayed on digital display 42.

Thus in operation in conjunction with a tachometer system with the power on, the display system operates as follows. If the tachometer shaft is turning, indicating a speed other than zero, memory circuit 40 has nothing stored in it and button 74 is not actuated. AND gate 90 responds providing an output through OR gate 98 to enable answer decoder 100 to decode the tachometer shaft speed on line 58 for display in digital display 42. Multiplier circuit 78 has properly modified the input shaft speed before delivery on line 58 to produce a proper magnitude corresponding to the units indicated by units memory 70.

If now the shaft stops turning and the signal on line 54 indicates zero shaft speed, and there is still nothing stored in memory circuit 40, AND gate 84, through OR gate 88, causes units decoder 80 to display in digital display 42 the units in which the system is currently operating. If the shaft is still turning and the signal on line 54 indicates other than zero shaft speed, and the operator actuates button 74, AND gate 112 sets the current shaft speed answer in memory circuit 40 and also causes it through OR circuit 98 and answer decoder 100 to be read out on digital display 42. Subsequently, when button 74 is released with the previous shaft speed value having been stored in memory 40, AND circut 104 has both its input conditions met and enables clock 107 to cycle ring counter 108, thus alternately enabling units decoder 80 and memory decoder 102 to display in digital display 42 the units and last tachometer shaft speed value.

Finally if shaft speed is at zero and button 74 is actuated AND gate 60 operates ramp circuit 62 for a sufficient interval to operate trigger circuit 64 and through AND gate 66 cause clock 68 to cycle units memory 70 through its stored list of units. Each unit, as it is withdrawn from units memory 70, is through units decoder 80 displayed by digital dislay 42. When the desired units appear at digital display 42, the operator releases button 74 and those units become the new units for the system.

Figure 4:
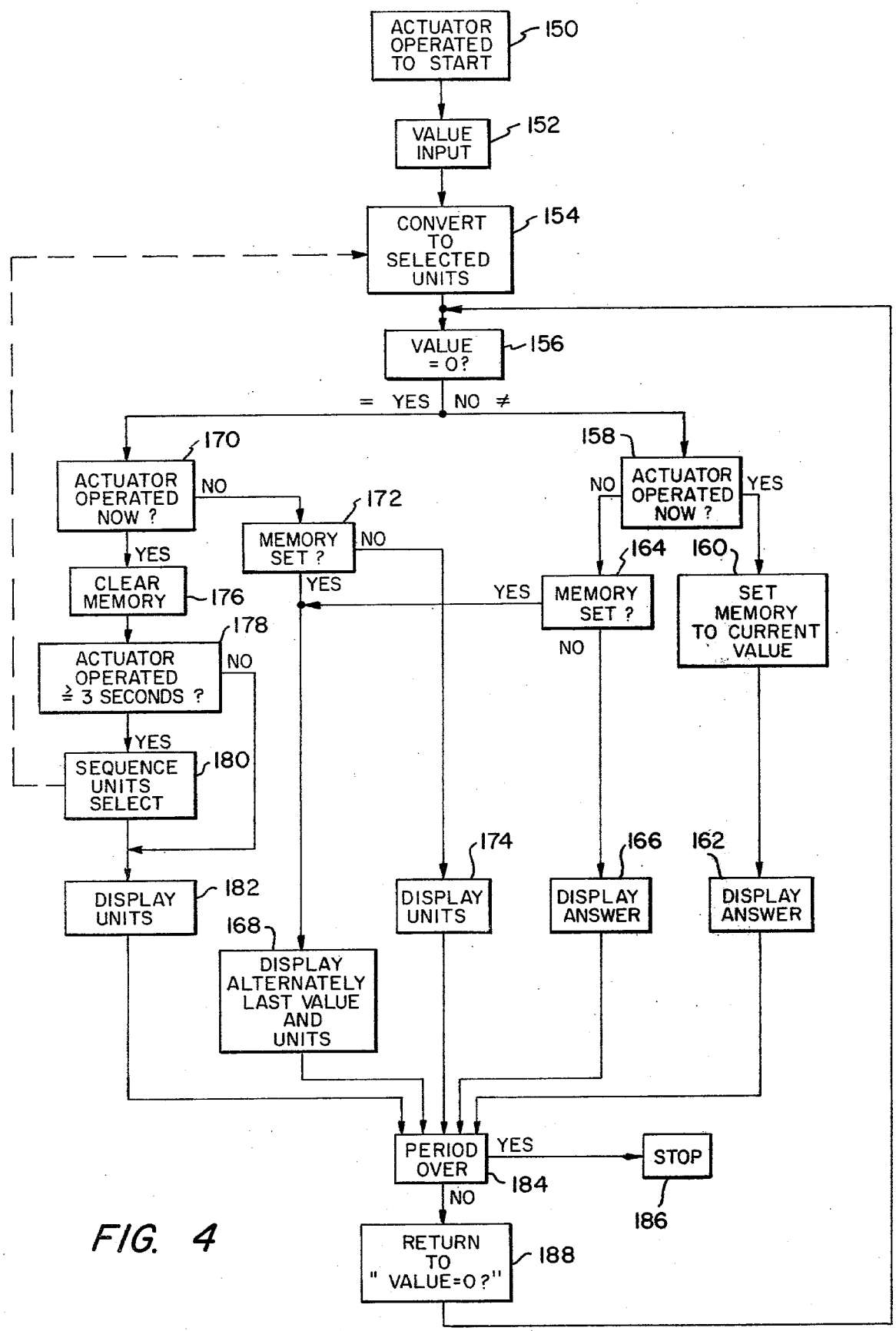
FIG. 4 is a flow chart illustrating the operation of the system of this invention.

The technique of this invention may be more readily understood from FIG. 4, which illustrates a flow chart embodying the invention. The circuit is initialized by operating, 150, the actuator. This powers the entire system, at least for a predetermined period of time, and enables the value input 152 to be converted, 154, to the proper form, compatible with the units in which the system is presently operating. Subsequently the value is checked, 156, to see if it is equal to a predetermined value. For example, if the display system is used in conjunction with a tachometer, the predetermined value may be chosen as zero shaft speed, representing that the shaft of the tachometer is not turning. If the answer is no, the value is not equal to the predetermined value, then it must be determined whether the actuator is being operated now, 158. If it is, the system is instructed to set the memory to the current value, 160, being supplied to the system, and that current value is simultaneously displayed, 162. If the actuator is not operating now, it is necessary to determine whether the memory is set, 164. If it is not, once again the answer is displayed, 166. If the memory is set, the system is caused to display alternately the last value, which is stored in the memory, and the units with which the system is presently operating, 168.

If at step 156 it is determined that the value being received is equal to the predetermined value, for example 0, is must then be determined once again whether the actuator is now being operated, 170. If it is not being actuated, it must next be determined whether the memory has been set, 172, that is whether anything is stored in the memory. If it has, then as in step 168 the value stored in memory should be displayed alternately with the units. If nothing is stored in memory, then the system simply displays units, 174. If the actuator is operated presently, memory is cleared, 176. If the actuator is operated for more than a predetermined interval of time, for example three seconds, 178, then the units memory is read out in sequence to select the new units, 180. As this is done this information is supplied elsewhere in the system so that as new values are received they are promptly converted to the proper magnitude in conjunction with the units in which the system is then operating.

After the new units have been selected they are displayed, 182. Each time either the answer, the units, or the answer and units alternately are displayed, the system is interrogated to determine whether the power-on period is over, 184. If it is over, operation is simply stopped, 186. If it is not, operation is returned, 188, to step 156, where once again the system seeks to determine whether or not the input value represents zero shaft speed, and operation continues.

Other embodiments will occur to those skilled in the art and are within the following claims:

What is claimed is:

1. A display system for selectively displaying a given value and associated units comprising: a value input circuit for providing values to be displayed; actuator means for selecting the values and/or units to be displayed; a units select circuit, responsive to operation of said actuator means and a predetermined value from said input circuit, for selecting the units to be displayed; display means; a units display circuit for enabling said display means to display the units chosen by said units select circuit when said input circuit provides a value other than said predetermined value; and a value display circuit for enabling said display means to display the value from the input circuit when that value is other than said predetermined value and said actuator means is unactuated.

2. The system of claim 1 further including: a memory circuit for storing a value presented by said input circuit; and a memory set circuit for enabling said memory circuit to store the value presented by said input circuit in response to the value being other than said predetermined value and said actuator being operated.

3. The system of claim 2 in which said memory circuit is enabled to clear any stored value in response to said units select circuit choosing a unit to be displayed.

4. The system of claim 2 further including a units/value alternate circuit for alternately enabling display by said display means of the value stored in said memory circuit and the selected units in response to said memory circuit being set and said actuator being operated.

5. The system of claim 2 in which said memory set circuit enables, when it clears said memory circuit, display by said display means of a said other value presented by said input circuit.

6. The system of claim 1 in which said units select circuit includes a units memory for storing units to be selected; means, when enabled, for sequentially reading out said units memory; means for enabling said means for reading out after a predetermined interval; and logic means responsive to said input circuit and said actuator for initiating said interval when said actuator is operated and ceasing said sequential reading out when operation of said actuator is ceased.

7. The system of claim 2 in which said units display circuit includes logic means responsive to the input circuit providing other than the predetermined value and the memory circuit having no value stored in it.

8. The system of claim 2 in which said value display circuit includes logic means responsive to the presence of a value other than said predetermined value and to the absence of operation of said actuator and the absence of a value stored in said memory circuit to enable display of the value from the input ciruit.

9. The system of claim 2 in which said units/value alternate circuit includes means for enabling said display means to sequentially, alternately display the value from said memory circuit and the selected units, and logic means responsive to the absence of operation of said actuator and to the presence of a value stored in said memory circuit for operating said means for enabling.

10. The system of claim 2 in which said memory set circuit includes logic means responsive to operation of said actuator and a value other than said predetermined value from said input circuit.

11. The system of claim 6 in which said units select circuit further includes an external storage for storing a value in said units memory upon loss of power and restoring that value to said units memory upon restoration of power.

* * * * *